US006413828B1

(12) United States Patent
Lam

(10) Patent No.: US 6,413,828 B1
(45) Date of Patent: Jul. 2, 2002

(54) PROCESS USING POLY-BUFFERED STI

(75) Inventor: Chung Hon Lam, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/520,502

(22) Filed: Mar. 8, 2000

(51) Int. Cl.⁷ .............................................. H01L 21/336
(52) U.S. Cl. ...................... 438/296; 438/404; 438/424
(58) Field of Search ................. 438/424, 296, 438/404

(56) References Cited

U.S. PATENT DOCUMENTS

| | | | |
|---|---|---|---|
| 5,177,028 A | * | 1/1993 | Manning |
| 5,731,241 A | | 3/1998 | Jang et al. |
| 5,741,738 A | | 4/1998 | Mandelman et al. |
| 5,786,262 A | | 7/1998 | Jang et al. |
| 5,834,358 A | | 11/1998 | Pan et al. |
| 6,153,472 A | * | 11/2000 | Ding et al. |
| 6,251,746 B1 | * | 6/2001 | Hong et al. |

\* cited by examiner

*Primary Examiner*—David L. Talbott
*Assistant Examiner*—David A. Zarneke
(74) *Attorney, Agent, or Firm*—Scully, Scott, Murphy & Presser; William D. Sabo

(57) ABSTRACT

A method of providing a substantially planar trench isolation region having substantially rounded corners, said method comprising the steps of: (a) forming a film stack on a surface of a substrate, said film stack comprising an oxide layer, a polysilicon layer and a nitride layer; (b) patterning said film stack to form at least one trench within said substrate, wherein said patterning exposes sidewalls of said oxide layer, polysilicon layer and nitride layer; (c) oxidizing the at least one trench and said exposed sidewalls of said oxide layer and said polysilicon layer so as to thermally grow a conformal oxide layer in said trench and on said exposed sidewalls of said oxide layer and said polysilicon layer; (d) filling said trench with a trench dielectric material; and (e) planarizing to said surface of said substrate.

27 Claims, 4 Drawing Sheets

PROCESS USING POLY-BUFFERED STI

FIELD OF THE INVENTION

The present invention relates to semiconductor device manufacturing, and in particular to a method of fabricating a trench isolation region, such as a shallow trench isolation (STI) region, within a substrate, wherein the trench isolation region is substantially planar and contains trench isolation/substrate corners that are rounded. By forming rounded corners, the present invention substantially eliminates the formation of divots at the trench isolation/substrate corner. The method of the present invention thus prevents polysilicon rail formation and reduces the early turn-on characteristics of transistors.

BACKGROUND OF THE INVENTION

In the manufacturing of semiconductor devices, it is well known to form isolation regions that electrically isolate the various active regions present within the device from each other. One method of electrically isolating the active device regions is to form a trench isolation region between adjacent devices. Such prior art trench isolation regions typically comprise a trench that is formed within the substrate and filled with a dielectric material such as $SiO_2$.

Three categories of trench isolation regions are known: including shallow trenches (trenches whose depth is less than about 1 $\mu$m), moderate trenches (trenches whose depth is from about 1 to about 3 $\mu$m), and deep trenches (trenches whose depth is greater than 3 $\mu$m). As the size of the semiconductor devices is continuously being scaled down, there is a greater interest in employing STI (shallow trench isolation) regions.

The prior art describes many different techniques that can be used in forming the STI regions within a substrate. One such prior art technique is shown in FIGS. 1A–1E. Specifically, FIG. 1A illustrates a fragment of wafer 10 that contains a semiconducting substrate 12 such as Si, upon which is formed an oxide layer 14, a nitride layer 16 and a patterned photoresist 18. Such a structure is formed utilizing conventional deposition steps and the patterned photoresist is formed by conventional lithography, e.g., applying a photoresist; exposing the photoresist to radiation so as to form a pattern in said photoresist and developing the pattern.

Referring to FIG. 1B, patterned photoresist 18 is used as a mask during a subsequent etching process. Thus during etching, unmasked portions of nitride layer 16, oxide layer 14 and semiconducting substrate 12 are removed using a dry etch process, i.e., reactive-ion etching (RIE), to form trench 20 within the substrate.

Next, as shown in FIG. 1C, the patterned photoresist is removed utilizing a conventional stripping process, and thereafter an oxide layer (or other trench dielectric material) 24 is deposited over the nitride layer and within the trench. Following the trench fill, oxide layer 24 is planarized down to upper surface 17 of nitride layer 16 by utilizing a conventional planarization process such as chemical-mechanical polishing (CMP) or grinding, See FIG. 1D. The planarization process forms an oxide plug 26 within the trench. As is also shown in FIG. 1D, oxide plug 26 has an upper surface 28 substantially co-extensive with upper surface 17. The plug also comprises sidewalls 33 and upper corners 34 where the sidewalls join upper surface 28.

Ideally, the upper surface of the plug would be planar, i.e., comprise a flat surface. Also, ideally, the corners of the plug comprise a 90° angle, and would therefore be substantially square. However, due to the practical limitations of the planarization process used, these ideal objectives cannot be met. Instead, as shown in FIG. 1D, surface 28 is concave instead of flat and the corners of the isolation region are not square.

In some cases, portions of plug 26 are removed at the corners of the STI region causing the formation of divots 30, See FIG. 1E. These divots would exist at the corner of the STI even if layers 14 and 16 are removed. The presence of divots at the STI/substrate corner is undesirable since they create unwanted features, such as polysilicon rails and an early turn-on characteristic in the device. In view of these drawbacks, methods are continuously being sought to eliminate the divots at the STI/substrate corner.

To date however no method has been developed that can provide a planar STI region that contains no divots at the corner regions between the STI and the substrate. The development of a method that is capable of fabricating a planar STI region containing no divots at the corners of the STI regions would represent a significant advancement in the art since it would improve the corner threshold voltage control of the structure making the structure suitable for use in a wide variety of logic and memory applications. Moreover, such a method would be beneficial since it would substantially eliminate the presence of polysilicon rails as well as reduce the early turn-on characteristics of the device.

SUMMARY OF THE INVENTION

The present invention provides a method of fabricating a semiconductor structure in which a substantially planar trench isolation region containing rounded trench isolation/substrate corners is formed—the rounded corners are advantageous in the present invention since they phase out divot formation—. Since the trench isolation regions of the present invention contain rounded corners, polysilicon rails and other like unwanted features are eliminated. The term "trench" includes deep trenches, moderate trenches and shallow trenches, whereas the term "trench isolation region" includes shallow trench isolation regions, moderate trench isolation regions and deep trench isolation regions.

Specifically, the method of the present invention comprises the steps of:
(a) forming a film stack on a surface of a substrate, said film stack comprising an oxide layer, a polysilicon layer and a nitride layer;
(b) patterning said film stack so as to form at least one trench within said substrate, wherein said patterning exposes sidewalls of said oxide layer, polysilicon layer and nitride layer;
(c) oxidizing the at least one trench and said exposed sidewalls of said oxide layer and said polysilicon layer so as to thermally grow a conformal oxide layer in said trench and on said exposed sidewalls of said oxide layer and said polysilicon layer;
(d) filling said trench with a trench dielectric material; and
(e) planarizing to said surface of said substrate.

The present invention also provides semiconductor devices which include at least one substantially planarized trench isolation region within a substrate, said planarized trench isolation region containing rounded corners which substantially phase away the formation of divots at the trench isolation/substrate corners.

DETAILED DESCRIPTION OF THE INVENTION

Figure 1A:
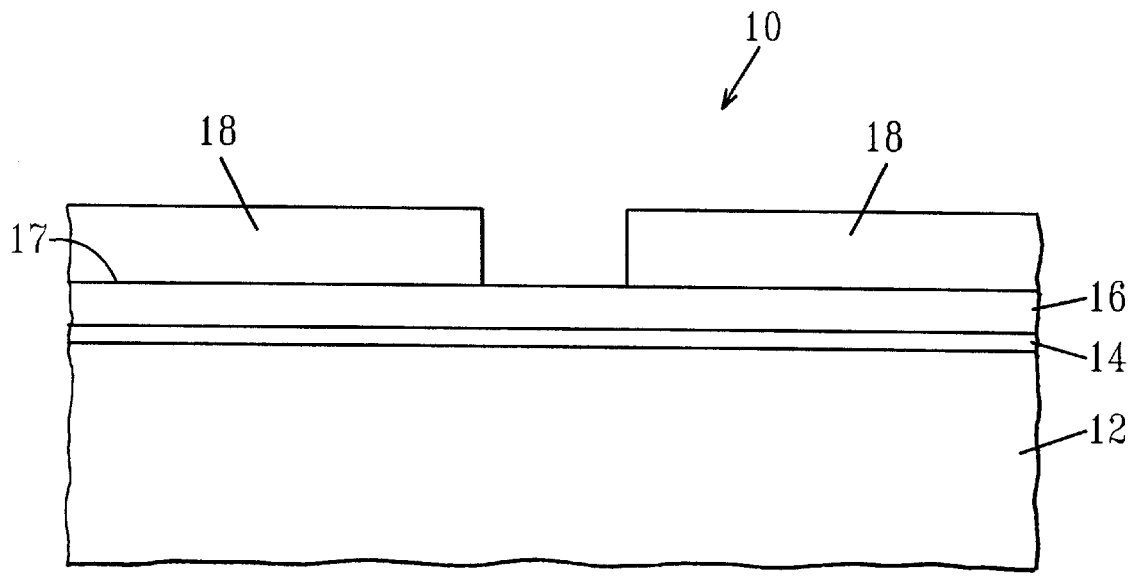
FIGS. 1A–1E are cross-sectional views of a structure in which a prior art method has been used in fabricating the STI region.
Figure 1B:
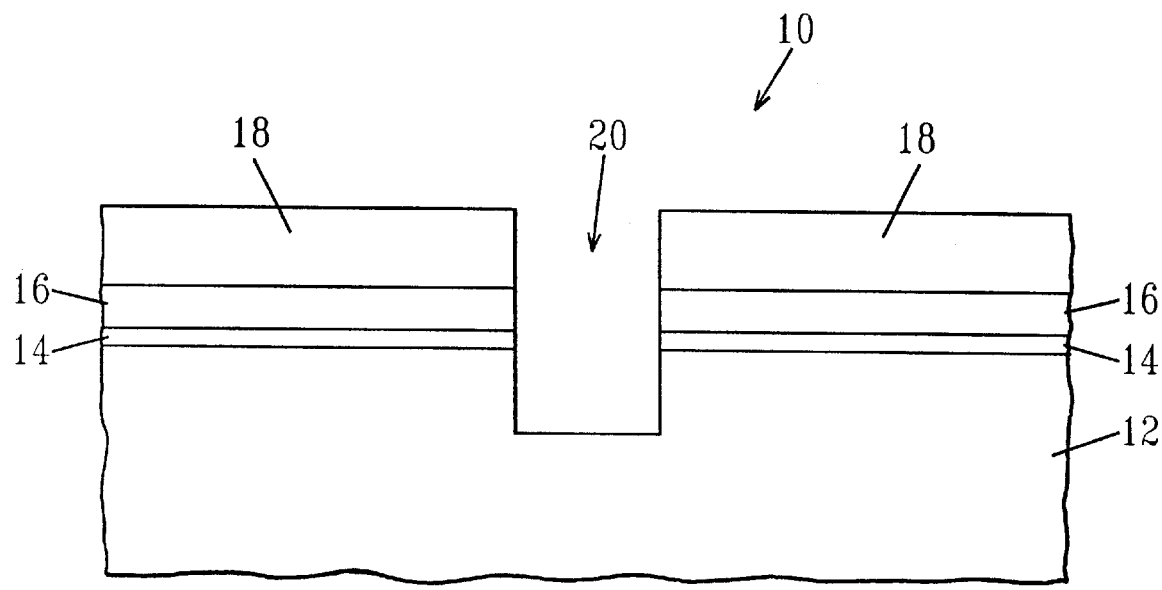
Figure 1C:
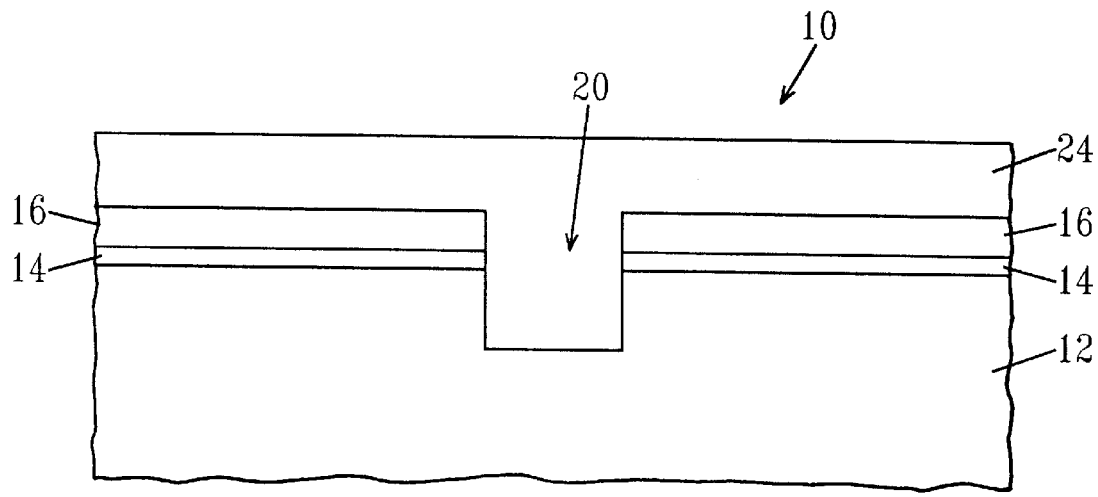
Figure 1D:
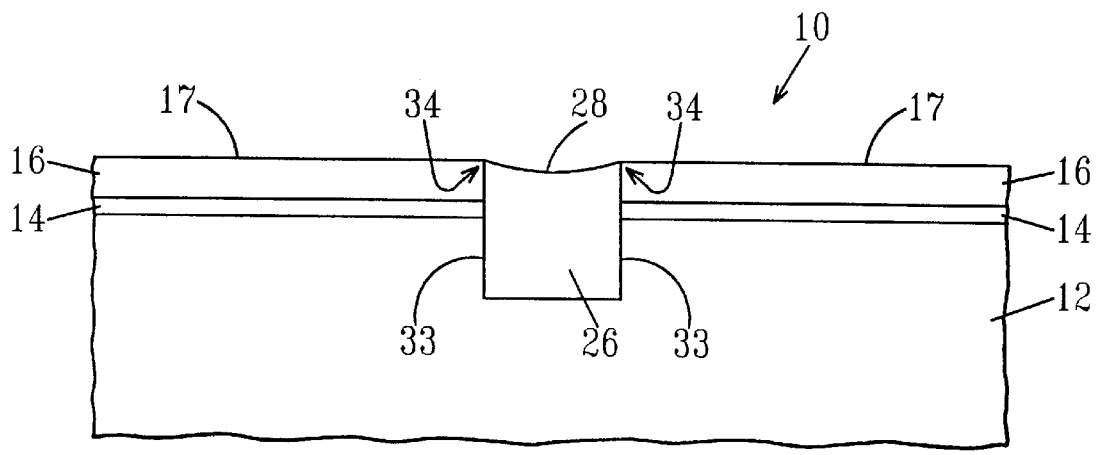
Figure 1E:
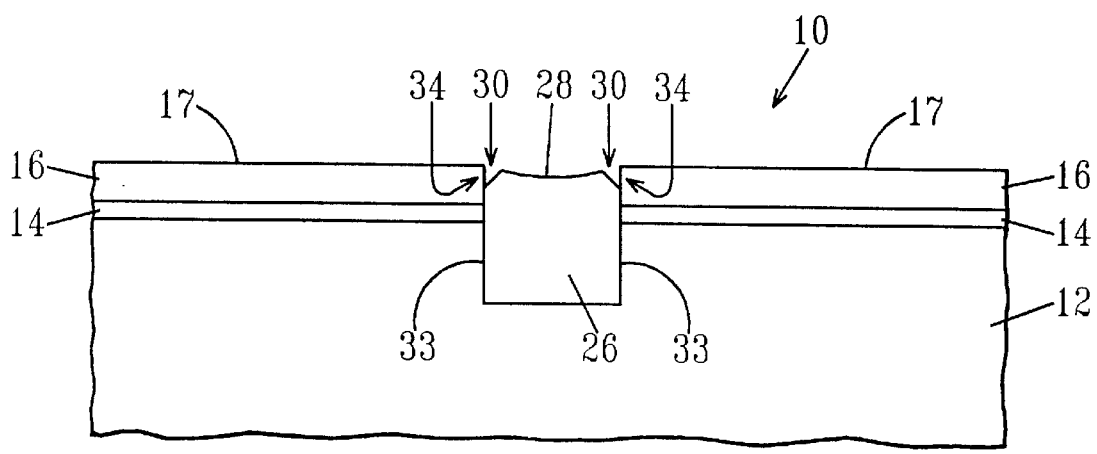

The present invention which provides a method of fabricating a substantially planar trench isolation region having rounded corners will now be described in greater detail by referring to the drawings that accompany the present invention. It should be noted that in the accompanying drawings like reference numerals are used for describing like and/or corresponding elements.

Reference is made to FIGS. 2A–2E which illustrate the basic processing steps that are employed in the present invention. It should be noted that although the description that follows is specific for forming shallow trench isolation (STI) regions, the present invention works well in fabricating moderate and deep trench isolation regions having rounded trench isolation/substrate corners. Combinations of the various types of trench regions are also contemplated herein.

Figure 2A:
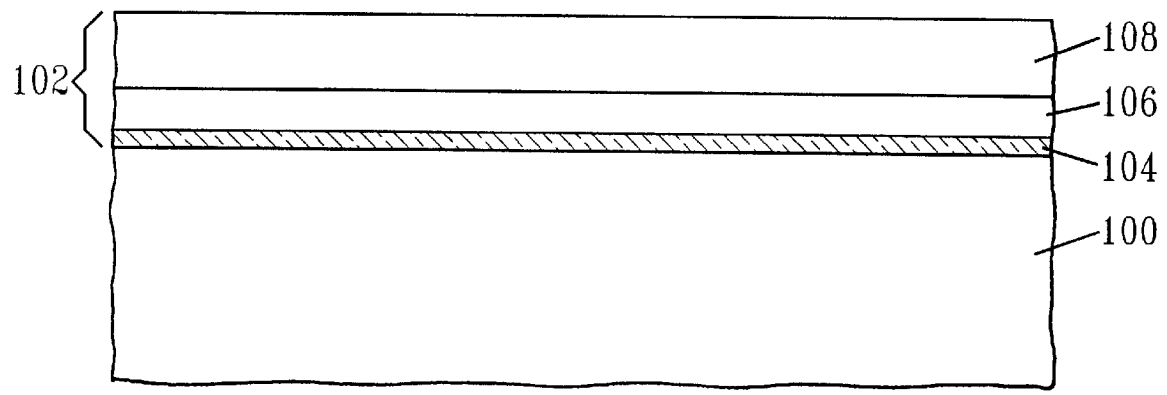
FIGS. 2A–2E are cross-sectional views of a structure in which the method of the present invention has been used in fabricating the STI region.

Specifically, FIG. 2A comprises an initial structure after conducting the first step of the present invention, i.e., after forming a film stack on the surface of a substrate. Specifically, the structure shown in FIG. 2A comprises a substrate 100 that contains film stack 102 formed on one of its surfaces.

Substrate 100 may be composed of any conventional semiconducting material including, but not limited to: Si, Ge, SiGe, GaAs, InAs, InP and all other III/V semiconductor compounds. The substrate may also be composed of a layered semiconductor such as Si/SiGe. The substrate may be of the n-type or the p-type depending on the type of device to be fabricated. The substrate may optional include various active regions either formed on the surface of the substrate or formed within the substrate prior to forming the film stack thereon.

The film stack employed in the present invention comprises a bottom oxide layer 104, a middle polysilicon layer 106 and a top nitride layer 108. Other material layers may also be present between the various layers mentioned above. It is noted that the various material layers are used in defining the trench for the STI region, thus the various layers of the film stack are removed during the final processing step of the present invention, i.e., during planarization.

Oxide layer 104 of film stack 102 is formed on the surface of substrate 100 using a conventional thermal growing process, or alternatively, the oxide layer may be formed by a conventional deposition process such as, but not limited to: chemical vapor deposition (CVD), plasma-assisted CVD, sputtering, evaporation and other like deposition processes. The thickness of oxide layer 104 may vary, but the oxide layer typically has a thickness of from about 5 to about 20 nm, with a thickness of from about 6 to about 12 nm being more highly preferred. Any oxide-containing material such as $SiO_2$ can be employed as oxide layer 104.

Insofar as polysilicon layer 106 is concerned, that layer is formed on the oxide layer utilizing a conventional deposition process such as CVD, plasma-assisted CVD and sputtering. The thickness of polysilicon layer 106 may vary, but the polysilicon layer typically has a thickness of from about 25 to about 200 nm, with a thickness of from about 80 to about 120 nm being more highly preferred.

The nitride layer of the film stack, i.e., nitride layer 108, is formed over polysilicon layer 106 by utilizing a conventional deposition process well known to those skilled in the art that is capable of forming a nitride layer. Illustrative examples of typically deposition processes that are employed in forming nitride layer 108 include, but are not limited to: CVD, plasma-assisted CVD, sputtering, evaporation and other like deposition processes. The thickness of nitride layer 108 may vary, but it typically has a thickness of from about 50 to about 300 nm, with a thickness of from about 100 to about 200 nm being more highly preferred Any material capable of forming a nitride layer such as $Si_3N_4$ and Si oxynitride may be employed in the present invention.

Figure 2B:
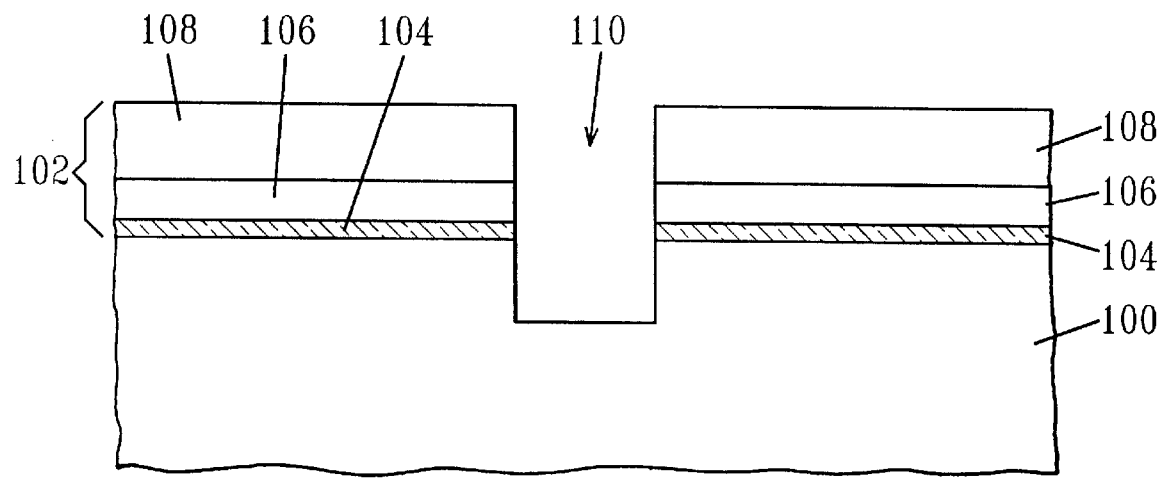

Next, as shown in FIG. 2B, the varies layers of the film stack are patterned so as to form trench 110 within the substrate—during the trench etch, sidewalls of the various layers present in the film stack are exposed—. It should be noted that although the drawings depict the formation of only one trench in the structure, the present invention can be used in forming a plurality of trenches in the structure. As stated above, the trench formed in the present invention may be a shallow trench, a moderate trench or a deep trench having the depths mentioned in the background section of this application. In a preferred embodiment, shallow trenches are formed.

Specifically, a photoresist, not shown in the drawings, is formed on the exposed surface layer of nitride layer 108 utilizing a conventional deposition process. The photoresist layer is then patterned utilizing conventional lithography so as to expose selective regions of the film stack in which trenches are to be formed. The lithography step employed in the present invention includes exposing the photoresist to radiation to form a pattern in the photoresist and developing the pattern. Since such steps are well known to those skilled in the art, a detailed description of the same is not needed herein.

The trench is then formed by etching the various layers of the film stack utilizing a conventional dry etching process such as RIE, ion-beam etching, plasma etching or any other like dry etch process. A combination of the aforementioned dry etch processes may also be used in providing the trench. Following trench etch, the patterned photoresist is removed by a conventional stripping process providing the structure illustrated in FIG. 2B.

Figure 2C:
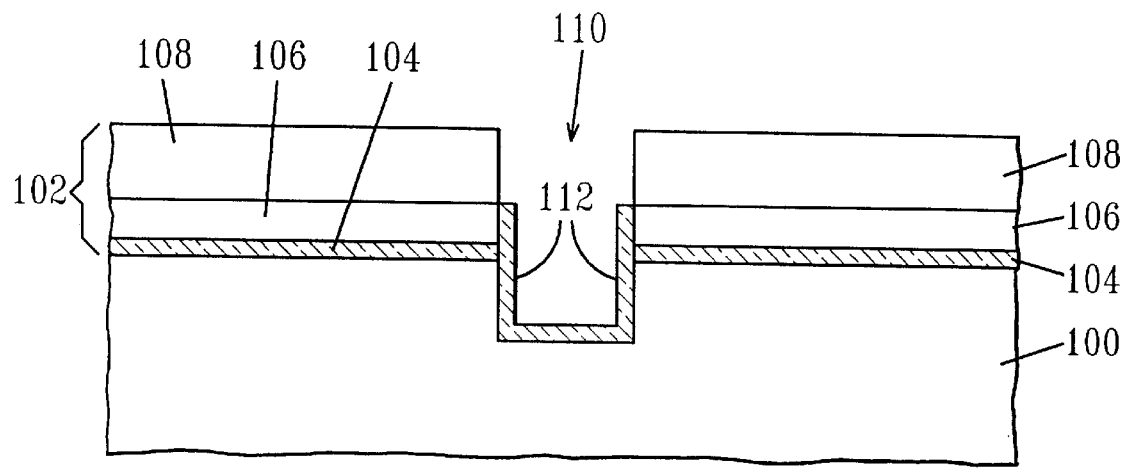

The next step of the present invention, which is shown in FIG. 2C, comprises oxidizing the trench as well as the exposed sidewalls of oxide layer 104 and polysilicon layer 106 under conditions that are capable of growing a conformal oxide layer 112 on the sidewalls of the trench extending up to, but not beyond, the polysilicon layer of the film stack.

The thermally grown oxide layer is formed by oxidizing the structure in an oxygen-containing atmosphere such as $O_2$, ozone, $N_2O$ and other like oxygen-containing atmospheres at a temperature of about 800° C. or above for a time period of about 30 minutes or less. Mixtures of oxygen-containing atmospheres are also contemplated herein. More preferable, conformal oxide layer 112 is formed by oxidizing the structure at a temperature of from about 900° to about 1000° C. for a time period of from about 5 to about 10 minutes. Time periods of about 5 minutes or less are highly preferred in the present invention. A single oxidation step may be employed, or if desired, the oxidation step may include various ramp and soak cycles. Other temperatures and times can also be employed in the present invention as long as they are capable of thermally growing a conformal oxide layer in the trench. For example, conventional furnace processing may be employed in growing the oxide layer in this step of the present invention.

In addition to oxygen-containing atmospheres, the present invention also contemplates the presence of about 90% or less of an inert gas such as He, Ar or $N_2$ admixed with the oxygen-containing atmosphere.

Under the above given parameters, a thermally grown oxide layer having a thickness of from about 10 to about 30 nm, more preferably of from about 18 to about 24 nm, can be formed in the trench and on exposed sidewalls of oxide layer 104 and the polysilicon layer 106.

Figure 2D:
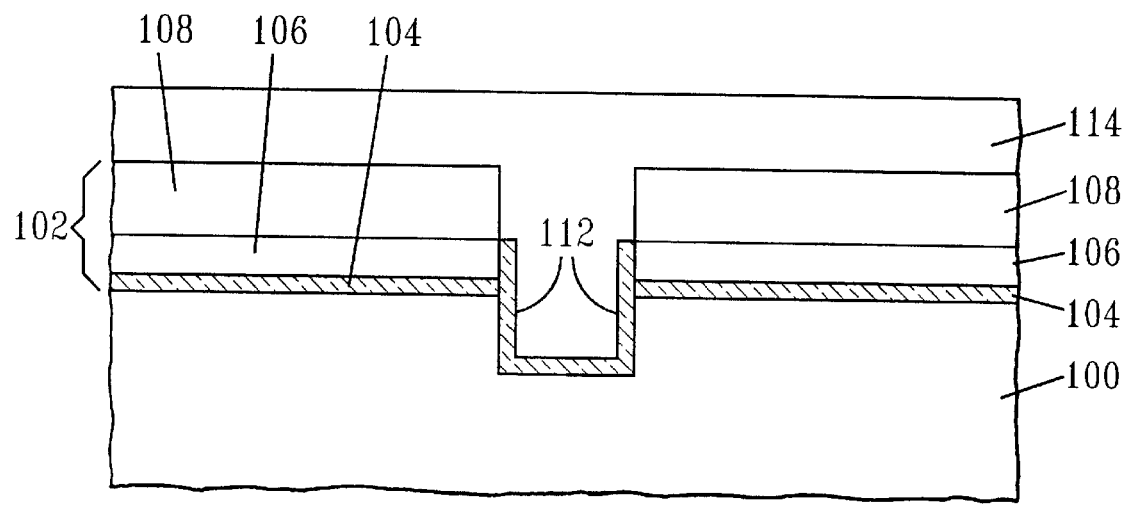

Next, as shown in FIG. 2D, a trench dielectric material 114 is formed in the trench utilizing conventional deposition processes including, but not limited to: CVD, plasma-assisted CVD, sputtering and other like deposition processes. Suitable trench dielectric materials that can be employed in the present invention include, but are not limited to: tetraethylorthosilicate (TEOS), $SiO_2$, flowable oxides and other like dielectric materials. When TEOS is employed, an optional densification step may be employed prior to planarization. It is noted that the deposition process employed in the filling the trench also forms a layer of the trench dielectric material on top of the nitride layer of the film stack, See FIG. 2D. In the embodiment shown in the drawings, the thermally grown oxide layer and trench dielectric material form STI region 116 of the structure. In embodiments wherein other trench depths are employed, region 116 is a trench isolation region that corresponds to the depth of the trench previously formed.

Figure 2E:
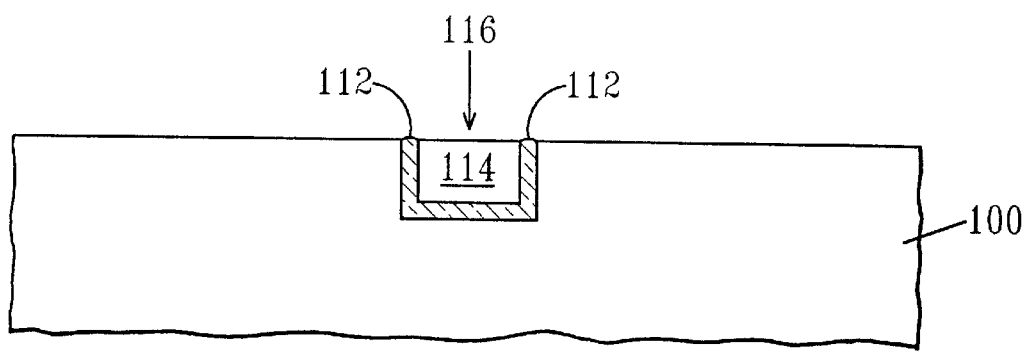

Next, as shown in FIG. 2E, the structure thus formed is planarized down to the surface of the substrate utilizing a conventional planarization process such as chemicalmechanical polishing (CMP) or grinding. Thus, during the planarization step, the various layers of the film stack are removed. As shown in FIG. 2E, the method of the present invention does not form any substantial divots at either of the STI/substrate corners. Divot formation is substantially phased away in the present invention because the conformal oxide layer formed in the manner indicated above, etches at a slower rate than the trench dielectric material. This differential in etch rate prevents the formation of a divot at the STI/substrate corner. Instead, rounded corners are formed in the present invention, as shown in FIG. 2E.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the scope of the appended claims.

Having thus described my invention in detail, what I claim is new, and desire to secure by the Letters Patent is:

1. A method of providing a substantially planar trench isolation region having rounded trench isolation/substrate corners, said method comprising the steps of:
    (a) forming a film stack on a surface of a substrate, said film stack comprising an oxide layer, a polysilicon layer and a nitride layer;
    (b) patterning said film stack so as to form at least one trench within said substrate, wherein said patterning exposes sidewalls of said oxide layer, polysilicon layer and nitride layer;
    (c) oxidizing the at least one trench and said exposed sidewalls of said oxide layer and said polysilicon layer so as to thermally grow a conformal oxide layer in said trench and on said exposed sidewalls of said oxide layer and said polysilicon layer;
    (d) filling said trench with a trench dielectric material; and
    (e) planarizing to said surface of said substrate.

2. The method of claim 1 wherein said substrate is composed of Si, Ge, SiGe, GaAs, InAs, InP or a layered semiconductor.

3. The method of claim 1 wherein said oxide layer of said film stack is thermally grown or deposited.

4. The method of claim 3 wherein said oxide layer of said film stack is deposited by chemical vapor deposition (CVD), plasma-assisted CVD, sputtering or evaporation.

5. The method of claim 1 wherein said oxide layer of said film stack has a thickness of from about 5 to about 20 nm.

6. The method of claim 5 wherein said oxide layer of said film stack has a thickness of from about 6 to about 12 nm.

7. The method of claim 1 wherein said polysilicon layer of said film stack is formed by a deposition process selected from the group consisting of CVD, plasma-assisted CVD and sputtering.

8. The method of claim 1 wherein said polysilicon layer of said film stack has a thickness of from about 25 to about 200 nm.

9. The method of claim 8 wherein said polysilicon layer of said film stack has a thickness of from about 80 to about 120 nm.

10. The method of claim 1 wherein said nitride layer of said film stack is formed by a deposition process selected from the group consisting of CVD, plasma-assisted CVD, evaporation and sputtering.

11. The method of claim 1 wherein said nitride layer of said film stack has a thickness of from about 50 to about 300 nm.

12. The method of claim 11 wherein said nitride layer of said film stack has a thickness of from about 100 to about 200 nm.

13. The method of claim 1 wherein said patterning includes lithography and etching.

14. The method of claim 13 wherein said lithography step includes applying a photoresist to said nitride layer of said film stack, patterning the photoresist by exposure, and developing the pattern in said photoresist.

15. The method of claim 13 wherein said etching step includes a dry etching process selected from the group consisting of reactive-ion etching (RIE), ion-beam etching, plasma etching or any combination thereof.

16. The method of claim 1 wherein said oxidizing is carried out in an oxygen-containing atmosphere at a temperature of about 800° C. or above and for a time period of about 30 minutes or less.

17. The method of claim 16 wherein said oxidizing is carried out at a temperature of from about 900° to about 1000° C. for a time period of from about 5 to about 10 minutes.

18. The method of claim 16 wherein said oxygen-containing atmosphere comprises $O_2$, ozone, $N_2O$ or mixtures thereof.

19. The method of claim 16 wherein said oxygen-containing atmosphere is admixed with an inert gas, said inert gas being present in an amount of about 90% or less in said mixture.

20. The method of claim 1 wherein said thermally grown oxide layer has a thickness of from about 10 to about 30 nm.

21. The method of claim 20 wherein said thermally grown oxide layer has a thickness of from about 18 to about 24 nm.

22. The method of claim 1 wherein said filling comprising a deposition process selected from the group consisting of CVD, plasma-assisted CVD and sputtering.

23. The method of claim 1 wherein said trench dielectric material is tetraethylorthosilicate (TEOS), $SiO_2$ or a flowable oxide.

24. The method of claim 23 wherein said trench dielectric material is TEOS and a densification step is employed prior to said planarizing.

25. The method of claim 1 wherein said planarizing comprises chemical-mechanical polishing or grinding.

26. The method of claim 1 wherein said at least one trench is a deep trench, a moderate trench, a shallow trench or any combinations thereof.

27. The method of claim 26 wherein said at least one trench is a shallow trench.

* * * * *